United States Patent
Li et al.

(10) Patent No.: US 9,647,698 B2
(45) Date of Patent: May 9, 2017

(54) METHOD FOR ENCODING MSR (MINIMUM-STORAGE REGENERATING) CODES AND REPAIRING STORAGE NODES

(71) Applicants: PEKING UNIVERSITY SHENZHEN GRADUATE SCHOOL, Shenzhen, Guangdong (CN); Hui Li, Shenzhen, Guangdong (CN)

(72) Inventors: Hui Li, Guangdong (CN); Hanxu Hou, Guangdong (CN); Bing Zhu, Guangdong (CN)

(73) Assignees: PEKING UNIVERSITY SHENZHEN GRADUATE SCHOOL, Shenzhen, Guangdong (CN); Hui Li, Shenzhen, Guangdong (CN)

( * ) Notice: Subject to any disclaimer, the term of this patent is extended or adjusted under 35 U.S.C. 154(b) by 0 days.

(21) Appl. No.: 13/978,315

(22) PCT Filed: Feb. 26, 2013

(86) PCT No.: PCT/CN2013/071872
§ 371 (c)(1),
(2) Date: Jul. 3, 2013

(87) PCT Pub. No.: WO2014/131148
PCT Pub. Date: Sep. 4, 2014

(65) Prior Publication Data
US 2015/0358037 A1   Dec. 10, 2015

(51) Int. Cl.
*H03M 13/00* (2006.01)
*G06F 11/10* (2006.01)

(52) U.S. Cl.
CPC ....... *H03M 13/617* (2013.01); *G06F 11/1076* (2013.01); *G06F 11/1088* (2013.01)

(58) Field of Classification Search
CPC ............. G06F 11/1076; G06F 11/1662; G06F 11/2094
See application file for complete search history.

(56) References Cited

U.S. PATENT DOCUMENTS

| 6,973,137 B2 * | 12/2005 | Birru | H04L 1/0057 348/469 |
| 7,944,988 B2 * | 5/2011 | Birru | H03M 13/256 375/240 |

(Continued)

*Primary Examiner* — Esaw Abraham
(74) *Attorney, Agent, or Firm* — Jackson IPG PLLC; Demian K. Jackson

(57) ABSTRACT

The invention relates to a method for encoding MSR (Minimum-storage Regenerating) codes, which comprises the following steps of: acquiring n first data packets which are represented by $S_i$, i=1, 2, ..., n; setting n storage nodes and a positive integer k, wherein n=2K; respectively adding a specified number of 0 bits on data heads or data tails of subsequent successive k first data packets by taking the next first data packet of the ith first data packet as a starting point, acquiring k second data packets, and acquiring an encoded data packet by computing the k second data packets; repeating the above steps and acquiring n encoded data packets which are represented by $P_i$, i=1, 2, ..., n; and storing the ith first data packet and the encoded data packet acquired by taking the next first data packet of the first data packet as the starting point into the ith storage node.

8 Claims, 5 Drawing Sheets

(56) References Cited

U.S. PATENT DOCUMENTS

| | | | | |
|---|---|---|---|---|
| 8,522,073 B2* | 8/2013 | Cohen | ............... | G06F 11/1662 |
| | | | | 714/4.11 |
| 8,631,269 B2* | 1/2014 | Vinayak | ............. | G06F 11/1662 |
| | | | | 714/4.11 |
| 8,645,799 B2* | 2/2014 | Li | ..................... | G06F 11/1076 |
| | | | | 714/770 |
| 8,719,667 B2* | 5/2014 | Le Scouarnec | ... | H03M 13/3761 |
| | | | | 714/763 |
| 9,104,603 B2* | 8/2015 | Le Scouarnec | ..... | G06F 11/1092 |

\* cited by examiner

METHOD FOR ENCODING MSR (MINIMUM-STORAGE REGENERATING) CODES AND REPAIRING STORAGE NODES

FIELD OF THE INVENTION

The invention relates to the distributed storage field, in particular to a method for encoding MSR (Minimum-storage Regenerating) codes and repairing storage nodes.

BACKGROUND OF THE INVENTION

With the rapid development of computer network applications, the amount of network information is larger and larger, and thus massive information storage is particularly important. The traditional file storage system can no longer meet the requirements of high capacity, high reliability, high performance and the like in the current applications. The distributed storage system has become an effective system for massive data storage with high extensibility and high availability. However, data storage nodes in the distributed storage system are unreliable, and thus redundancy is required to be introduced into the storage system for the unreliable storage nodes to provide reliable storage service. The simplest method for the introduction of redundancy is to directly backup raw data. Although the direct backup method is simple, the storage efficiency and system reliability are not high. The method for introducing redundancy by encoding can improve the storage efficiency. In the current storage systems, the encoding method generally adopts MDS (Maximum Distance Separable) codes. The MDS codes can achieve optimum storage space and efficiency. As for an (n, k) MDS EC (Erasure Code), an original file is required to be divided into k fragments equally; n unrelated encoded fragments are generated via linear encoding; different fragments are stored into n nodes; and the MDS property (the original file can be reconstructed by any k encoded fragments among the n encoded fragments) can be met. The encoding technology is important in providing efficient network storage redundancy, especially in large file storage and file data backup application.

In the distributed storage system, data with the size B is stored into n storage nodes, and the size of data stored into each storage node is $\alpha$. Data receivers can reconstruct the raw data B only by connecting and downloading the data in any k storage nodes among the n storage nodes, which is known as the "data reconstruction process". RS (Reed-Solomon) code is a code which meets the characteristics of the MDS codes. When a storage node in the storage system fails, the data stored into the failed node must be repaired and stored into a new node in order to maintain the redundancy of the storage system, which is known as the "repair process". However, in the repair process, as for the RS code, the data in the k storage nodes must be downloaded at first and then the raw data must be reconstructed, and subsequently the storage data of the failed node must be encoded into the new node. The method for decoding the whole raw data in order to restore the data in one storage node obviously wastes bandwidth.

Moreover, in the case of system node failure or file loss, the system redundancy may be gradually reduced over time. Therefore, a mechanism is required for guaranteeing the system redundancy. ECs (Erasure Codes) put forward in the literature [R. Rodrigues and B. Liskov, "High Availability in DHTs: Erasure Coding vs. Replication", Workshop on Peer-to-Peer Systems (IPTPS) 2005.] are relatively effective in reducing the storage overhead but also have relatively high communication overhead required for supporting redundancy recovery. FIG. 1 indicates that a original file can be acquired from the available nodes as long as the number of effective nodes in the system d is more than or equal to k, namely d≥k. FIG. 2 indicates the process of restoring the content stored in a failed node. As illustrated in FIGS. 1 and 2, the whole recovery process comprises the following steps of: 1) firstly, downloading data from k storage nodes in the system and reconstructing the original file; and 2) recoding a new fragment based on the original file and storing the new fragment into a new node. The recovery process indicates that the network load required for repairing any failed node is at least the content stored in the k nodes.

Meanwhile, in order to reduce the bandwidth used in the repair process, the literature [A G Dimakis P G Godfrey, M J Wainwright, K. Ramchandran, "Network Coding for distributed storage systems", IEEE Proc. INFOCOM, Anchorage, Ak., May 2007.] puts forward RGCs (Regenerating Codes) in virtue of the network coding theory, and the RGCs also meet the characteristics of the MDS codes. During the RGC repair, new nodes must be connected with d storage nodes among residual storage nodes and respectively download the data with the size $\beta$ from the d storage nodes, so the RGC repair bandwidth is $d\beta$. Simultaneously, a RGC functional repair model is provided. In addition, two types of optimum codes for the RGCs are provided, namely MSR (Minimum-storage Regenerating) codes and MBR (Minimum-bandwidth Regenerating) codes. The repair bandwidth of the RGCs is superior to that of RS codes, but the RGC repair process requires the connection of d(d>k) storage nodes (d is known as "helper nodes"). Moreover, the helper nodes must execute random linear network coding operation on the data stored into the helper nodes. In order to meet the requirement of mutually independent encoded packets, the RGC computation must be executed within a large finite field.

The patent PCT/CN2012/083174 provides a method for encoding PPSRCs (Practical Projective Self-repairing Codes), and reconstructing and repairing data. The PPSRCs also have two typical properties of self-repairing codes: one is that missing encoded fragments can download the data, of which the size is less than that of the whole file, from other encoded fragments for repair; and the other is that the missing encoded fragments are repaired from a specified number of fragments, wherein the specified number is only related to the number of the missing fragments and not related to which fragments are missing. Due to the properties, the load for repairing one missing fragment is relatively low. In addition, due to the same status and balanced load of various nodes in the system, different missing fragments can be independently and concurrently repaired at different positions of the network.

Except for meeting the above conditions, the code also has the characteristics that: when one node fails, (n−1)/2 pairs of repair nodes are available for selection; and when (n−1)/2 nodes fail at the same time, two nodes among the residual (n+1)/2 nodes are available for repairing the failed nodes.

The PPSRC encoding and self-repairing process only involves XOR (Exclusive OR). As for general self-repairing codes, the encoding process involves polynomial arithmetic and is relatively complex. The computation complexity of the PPSRCs is less than that of PSRCs (Projective Self-repairing Codes). Meanwhile, the repair bandwidth and repair nodes of the PPSRCs are superior to those of the MSR codes. Moreover, as the redundancy is controllable, the PPSRCs are applicable to general storage systems. And optimum reconstruction bandwidth of the PPSRCs can be achieved.

In summary, the PPSRCs have the advantages of effectively reducing the number of data storage nodes, reducing the redundancy of system data storage, and greatly improving the use value of the PSRCs.

However, the PPSRCs also have the following disadvantages. Firstly, the encoding and decoding processes of the PPSRCs are relatively complex; the division operand of finite fields and subdomains thereof is relatively large; and the data reconstruction process is relatively complex. Secondly, in the PPSRCs, encoded fragments are inseparable, and thus the repair of the encoded fragments must also be inseparable. Thirdly, as the computation complexity of the whole encoding and decoding processes of the PPSRCs is relatively high, the redundancy is comparatively high although controllable. In general, the number of storage nodes of the PPSRCs is very large, so the PPSRCs are completely unnecessary for relatively small files. Therefore, the PPSRCs are more difficult to implement in the practical distributed storage systems, and thus have low versatility.

The patent PCT/CN2012/071177 provides a method of RGCs. In the proposal, a missing encoded fragment can be repaired by utilizing a small amount of data but not by reconstructing the whole file. The RGC utilizes the linear network coding theory and the NC (Network Coding) property (namely max-flow min-cut) to improve the overhead required for repairing an encoded fragment. It can be proved from the network information theory that the missing fragment can be repaired by using the network overhead with the same data size with the missing fragment.

The main idea of the RGCs is to utilize the MDS property. When some storage nodes in the network fail, it means that the storage data is missing, and then the information is required to be downloaded from available effective nodes to repair the missing data fragment, and then the data is stored into a new node. A plurality of original nodes may fail over time, and certain regenerated new nodes can re-execute the regeneration process based on the regenerated novel nodes and generate more new nodes. Therefore, the regeneration process must ensure two things: 1) the failed nodes are mutually independent and the regeneration process can be recursive; and 2) the primary file can be restored via any k nodes.

FIG. 2 illustrates the regeneration process when a node fails. In a distributed system, the data with the number of $\alpha$ is stored into n storage nodes respectively. When a node fails, a new node downloads the data from other $d \geq k$ active nodes and uses the data for node regeneration. The download of each node is $\beta$. A pair of nodes $X^i_{in}$, $X^i_{out}$ are used for representing each storage node i and are connected with each other via an edge of which the capacity is the storage capacity (namely $\alpha$) of the node. The regeneration process is illustrated by an information flow graph, wherein $X_{in}$ respectively acquires the data with the number of $\beta$ from any d active nodes in the system; the data with the number of $\alpha$ is stored into $X_{out}$ via $$X_{in} \xrightarrow{\alpha} X_{out};$$

and any data collector can access $X_{out}$. The maximum information flow from information source to information sink is determined by the minimal cut set in the figure. When the information sink requires the reconstruction of the original file, the size of the flow cannot be less than that of the original file.

There is a tradeoff between the storage capacity $\alpha$ of each node and the bandwidth $\gamma$ required for the regeneration of a node. Therefore, the MBR codes and the MSR codes are introduced. As for the minimum storage nodes, at least M/k bits are stored into each node, and then the $$(\alpha_{MSR}, \gamma_{MSE}) = \left( \frac{M}{k}, \frac{Md}{k(d-k+1)} \right)$$

in the MSR codes can be deduced. When d adopts the maximum value, namely when a new node connected all the active n−1 nodes simultaneously, the repair bandwidth $\gamma_{MSR}$ is minimum, namely $$\gamma_{MSR}^{min} = \frac{M}{k} \cdot \frac{n-1}{n-k}.$$

Moreover, as the MBR codes have minimum repair bandwidth, it can be deduced that the minimum repair load $$(\alpha_{MBR}^{min}, \gamma_{MBR}^{min}) = \left( \frac{M}{k} \cdot \frac{2n-2}{2n-k-1}, \frac{M}{k} \cdot \frac{2n-2}{2n-k-1} \right)$$

can be achieved when d=n−1.

As for the problem of failed node repair, three repair models are taken into consideration: firstly, exact repair, namely a failed fragment is required for correct construction and the information restored is the same with the missing one (the core technology is interference queue and NC); secondly, functional repair, namely a new fragment can contain the data which is different from that of the missing node as long as the repaired system supports the MDS code property (the core technology is NC); and thirdly, partial system exact repair, which is a hybrid repair model between exact repair and functional repair, wherein in the hybrid model, system nodes (used for storing uncoded data) are required for exact repair, namely the information restored must be the same with the information stored in the failed node, and non-system nodes (used for storing encoded fragments) are not required for exact repair and only required for functional repair as long as the information restored can meet the MDS code property (the core technology is interference queue and NC).

In order for the RGCs to be applied to practical distributed systems, the missing fragment can only be repaired by downloading data from at least k nodes even if not optimal. Therefore, even though the data transmission quantity required in the repair process is relatively low, the RGCs require high protocol load and system design (NC technology) complexity. Moreover, as the engineering solution such as the idle repair process is not considered in the RGCs, the case of load repair due to temporary failure cannot be avoided. Furthermore, the computational overhead required for the implementation of encoding and decoding of the NC-based RGCs is relatively large and is an order of magnitude higher than the traditional ECs.

SUMMARY OF THE INVENTION

The technical problem to be solved by the invention is to overcome the defects of complex computation, high overhead and high repair bandwidth and provide a method for encoding MSR (Minimum-storage Regenerating) codes and repairing storage nodes, wherein the method has the advantages of simple computation, low overhead and low repair bandwidth.

The technical proposal adopted by the invention to solve the technical problem is that: the invention relates to a method for encoding MSR (Minimum-storage Regenerating) codes, which comprises the following steps of:

A) dividing raw data into n data blocks and acquiring n first data packets, in which the first data packets are represented by $S_i$, i=1, 2, . . . , n, and n is an even integer;

B) setting n storage nodes and a positive integer k, in which n=2k;

C) taking the next first data packet of the ith first data packet as a starting point, respectively adding a specified number of 0 bits on data heads or data tails of the starting point and subsequent successive k−1 first data packets, acquiring k second data packets, and acquiring an encoded data packet by computing the k second data packets; and repeating the above steps and acquiring n encoded data packets represented by $P_i$, i=1, 2, . . . , n, in which the nth first data packet and the $1^{st}$ first data packet are successive, namely the next successive first data packet is the $1^{st}$ first data packet when one among the successive k first data packets is the nth first data packet; and D) storing the ith first data packet and the encoded data packet acquired by taking the next first data packet of the first data packet as the starting point into the ith storage node.

Moreover, the step C) further comprises the following steps of:

C1) acquiring k encoding IDs;

C2) taking the next first data packet of the ith first data packet as the starting point, respectively adding a specified number of 0 bits on the data heads or data tails of the starting point and the subsequent successive k−1 first data packets according to corresponding encoding IDs, and acquiring the k second data packets; and acquiring the encoded data packet by computing the k second data packets; and C3) respectively taking the subsequent first data packet of the first data packet taken as the starting point in the step C2) as a starting point, and repeating the step C2) until the n encoded data packets are acquired.

Moreover, the step C1) further comprises the following steps of:

C11) determining whether k is a prime number, and executing step C12) if so and executing step C13) if not;

C12) respectively substituting a=1, 2, . . . , k into an array (0, a, 2a, . . . , (k−1)a) according to $(r_1^a, r_2^a, \ldots, r_k^a)$=(0, a, 2a, . . . , (k−1)a)mod k, a=1, 2, . . . , k, respectively solving for k mod on acquired elements in the array, and acquiring the k encoding IDs; and C13) selecting the minimum prime p that is more than k, respectively substituting a=1, 2, . . . , p−1 into an array (a−1, 2a−1, 2a, . . . , ka−1) according to $(r_1^a, r_2^a, \ldots, r_k^a)$=(a−1, 2a−1, . . . , ka−1)mod p, a=1, 2, . . . , p−1, respectively solving for p mod on acquired elements in the array, and acquiring the k encoding IDs.

Moreover, the step C2) further comprises the following steps of:

C21) selecting the maximum encoding ID, namely $r_{max}$=max$(r_1^a, r_2^a, \ldots, r_n^a)$;

C22) adding 0 bits with the number of the "i+1"th element value of the encoding ID on a data head of the "i+1"th first data packet, adding $r_{max}-r_i^a$ 0 bits on a data tail of the "i+1"th first data packet, and acquiring a second data packet;

and repeating the above steps on the successive k first data packets beginning from the "i+1"th first data packet, and acquiring the k second data packets; and C23) adding the acquired k second data packets (namely executing XOR (Exclusive OR) on the data packets mutually) and acquiring the ith encoded data packet, namely $$p_i = \sum_{j=(i+1)mod n}^{(k+i)mod n} s_j(r_t^j), i = 1, 2, \ldots, n, t \in \{1, 2, \ldots, k\},$$

in which $p_i$ represents the encoded data packet acquired by taking the next first data packet of the ith first data packet as the starting point; $s_j(r_t^j)$ represents the jth second data packet, and j is a positive integer between (i+1)mod n and (i+k)mod n; t is between 1 and k along with the successive k data packets, namely t=1 when the successive $1^{st}$ second data packet is acquired, t=2 when the successive $2^{nd}$ second data packet is acquired, . . . until t=k when the successive kth second data packet is acquired; and the symbol "mod" indicates solving for mod on the previous number or array by use of the number after the symbol.

Furthermore, the first data packets and the encoded data packets in the storage nodes are respectively stored, and the set of data packets stored into the ith storage node is represented by $(s_i, p_i)$.

Furthermore, the data size of a original file is n.

The invention also relates to a method for repairing storage nodes used for storing the coded data, which comprises the following steps of:

I) determining that the ith storage node fails and acquiring an encoding ID;

J) downloading first data packets on active storage nodes from i+1 to i+k in turn, in which the downloaded k storage nodes are successive; and acquiring an encoded data packet of the ith storage node by executing XOR coding on the downloaded k first data packets;

K) downloading an encoded data packet of the "i−1"th storage node and acquiring first data packets of storage nodes from i+1 to i+k−1, in which k−1 storage nodes from which the first data packets are downloaded are successive; and acquiring a first data packet of the ith storage node by executing XOR coding on the downloaded encoded data packet and k−1 original data packets; and L) combining the first data packet and the encoded data packet acquired by operation and storing the first data packet and the encoded data packet into a new ith storage node.

Moreover, the step J) comprises the following steps of:

J1) acquiring k encoding IDs;

J2) selecting the maximum encoding ID, namely $r_{max}$=max$(r_1^a, r_2^a, \ldots, r_n^a)$;

J3) adding 0 bits with the number of the "i+1"th element value of the encoding ID on a data head of the "i+1"th first data packet, adding $r_{max}-r_i^a$ 0 bits on a data tail of the "i+1"th first data packet, and acquiring a second data packet; and repeating the above steps on successive k first data packets beginning from the "i+1"th first data packet, and acquiring k second data packets; and J4) adding the acquired k second data packets (namely executing XOR on the data packets mutually) and acquiring the ith encoded data packet, namely $$p_i = \sum_{j=(i+1)mod n}^{(k+i)mod n} s_j(r_t^j), i = 1, 2, \ldots, n, t \in \{1, 2, \ldots, k\},$$

in which $p_i$ represents the encoded data packet acquired by taking the next first data packet of the ith first data packet as a starting point; $s_j(r_t^i)$ represents the jth second data packet, and j is a positive integer between (i+1)mod n and (i+k)mod n; and t is between 1 and k along with the successive k data packets, namely t =1 when the successive 1st second data packet is acquired, t=2 when the successive 2nd second data packet is acquired, . . . until t=k when the successive kth second data packet is acquired.

Furthermore, the step K) comprises the following steps of:

K1) downloading the encoded data packet of the "i−1"th storage node and acquiring the first data packets of the storage nodes from i+1 to i+k−1, in which the k−1 storage nodes from which the first data packets are downloaded are successive;

K2) acquiring a corresponding second data packet of the ith storage node by executing XOR coding on the encoded data packet of the "i−1"th storage node and k−1 first data packets, namely $$s_i(r_1^{i-1}) = p_{i-1} + \sum_{j=(i+1) \bmod n}^{(i+k-1) \bmod n} s_j(r_t^{j-1}), i = 1, 2, \ldots n, t \in \{2, 3, \ldots, k\},$$

in which $s_i(r_1^i)$ represents the ith second data packet; j is a positive integer between (i+1)mod n and (i+k−1)mod n; and t is between 2 and k along with the successive k−1 data packets, namely t=2 when the successive $1^{st}$ second data packet is acquired, t=3 when the successive $2^{nd}$ second data packet is acquired, . . . until t=k when the successive "k−1"th second data packet is acquired;

K3) acquiring the k encoding IDs; and

K4) removing the 0 bits added on the data head and the data tail of the acquired ith second data packet according to the encoding ID, and acquiring the ith first data packet of the ith storage node.

The method for encoding the MSR codes and repairing the storage nodes, provided by the invention, has the advantages that: the BMSR (Binary Minimum-storage Regenerating) codes meet the base properties of the regenerating codes, namely a missing encoding fragment can be repaired by utilizing a small amount of data but not by reconstructing the whole file; the BMSR codes utilizes the linear network coding theory and the NC (Network Coding) property to improve the overhead required for repairing an encoding fragment, and the missing fragment can be repaired by using the network overhead with the same data size with the missing fragment; when some storage nodes in the network fail, it means that the storage data is missing, and then the information can be downloaded from available active nodes to repair the missing data fragments and the data can be stored into a new node; and meanwhile, certain regenerated new nodes can re-execute the regeneration process based on the regenerated new nodes and generate more new nodes. The encoding method ensures two things: firstly, the failed nodes are mutually independent and the regeneration process can be recursive; and secondly, the original file can be restored via any k nodes. Therefore, the BMSR codes can guarantee that the size of data stored in each node is theoretically minimum and the obliterated data of a failed node can be restored by downloading data from k nodes. Consequently, the method for encoding the MSR codes and repairing the storage nodes has the advantages of simple computation, low overhead and low repair bandwidth.

DETAILED DESCRIPTION OF THE PREFERRED EMBODIMENTS

Further description is given to the embodiments of the invention with the attached drawings.

Figure 1:
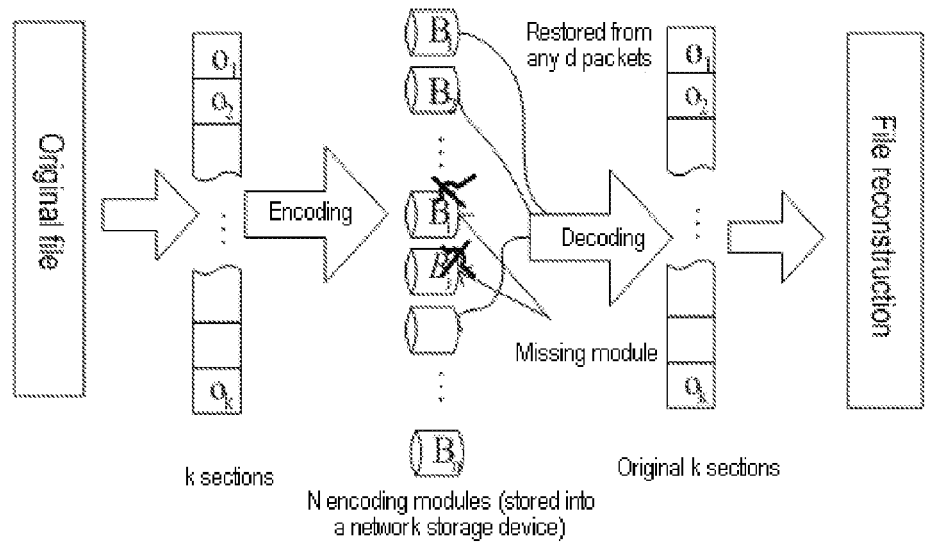
FIG. 1 is a data reconstruction diagram of ECs (Erasure Codes) in the prior art.
Figure 2:
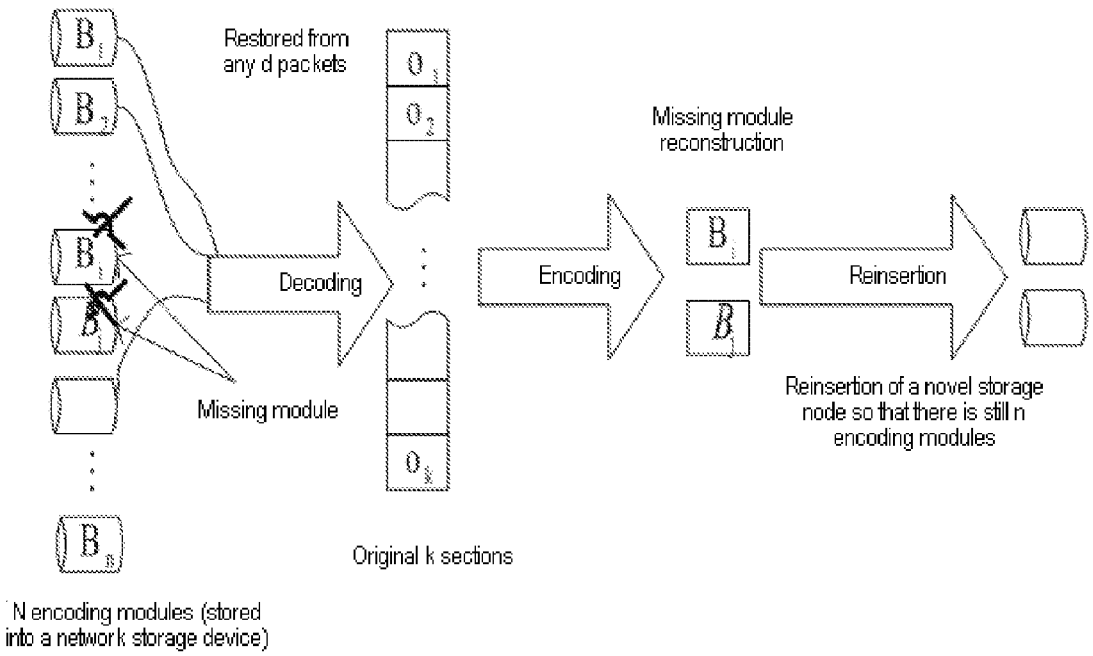
FIG. 2 is a schematic diagram illustrating the repair of failed storage nodes of ECs in the prior art.
Figure 3:
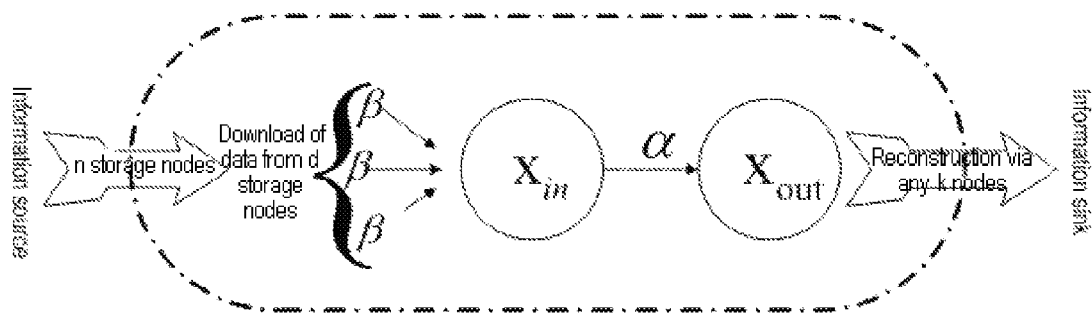
FIG. 3 is a data reconstruction diagram of RGCs (Regenerating Codes) in the prior art.
Figure 4:
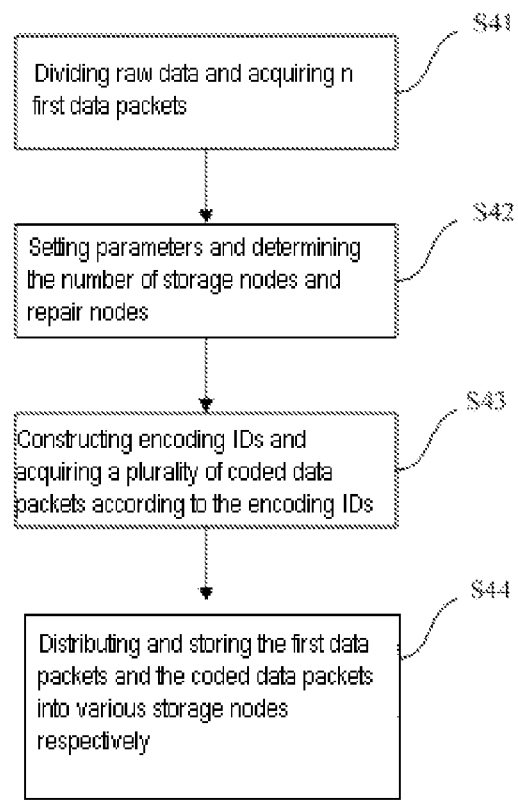
FIG. 4 is a flow chart of the encoding method in the embodiment of the method for encoding MSR (Minimum-storage Regenerating) codes and repairing storage nodes, provided by the invention.
Figure 5:
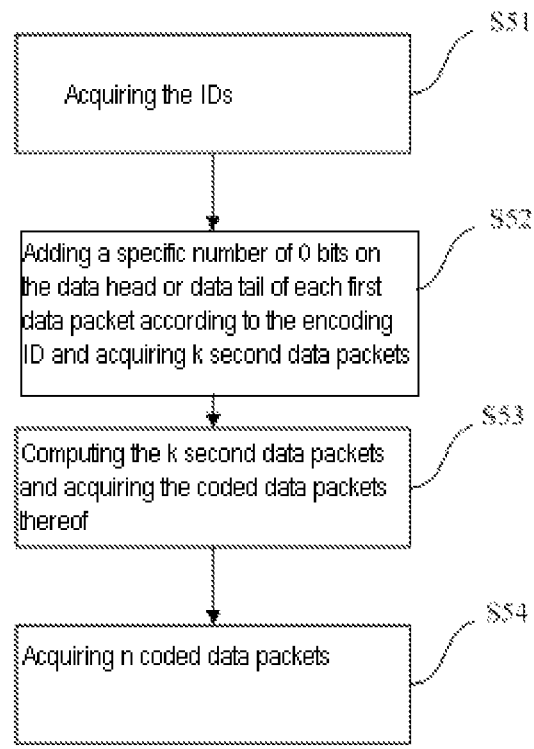
FIG. 5 is a flow chart illustrating the process of acquiring coded data packets in the embodiment.

As illustrated in FIG. 4, in the embodiment of the method for encoding MSR (Minimum-storage Regenerating) codes and repairing storage nodes, the method for encoding the MSR codes comprises the following steps of:

Step S41: dividing raw data and acquiring n first data packets. In the step, the raw data to be stored on the network is divided into n sections, and the n first data packets are acquired. That is to say, the data length of each first data packet is the same with that of other first data packets. For example, supposing there are 6 characters in the raw data, the simplest method is to divide the raw data into 6 sections and acquire 6 first data packets. Each first data packet has 1 character, with the same data length. Of course, it may be not so simple in the practical application, but the example is enough to illustrate the method for dividing the raw data. In the embodiment, the first data packets are represented by $S_i$, i=1, 2, . . . , n.

Step S42: setting parameters and determining storage nodes. In the step, the parameters related to encoding are set, which includes the set of the number of the storage nodes. For example, the total amount of the storage nodes is set to be n; the number of storage nodes used for data repair (namely repair nodes) is set to be k+1; both n and k+1 are positive integers; and n=2k. In the embodiment, with respect to the divided sections in the above step, the number of the storage nodes is set to be n, and meanwhile, the number of the repair nodes is set to be k+1. In the embodiment, as the first data packets are directly acquired by dividing the raw data, it can be deemed that the first data packets are mutually independent. Moreover, the aim of encoding is to acquire n-k coded data packets which are mutually independent. In addition, the coded data packets and the first data packets are mutually independent as well.

Step S43: constructing encoding IDs and acquiring a plurality of coded data packets according to the encoding IDs. In the step, firstly, n encoding IDs are constructed. Each encoding ID corresponds to a first data packet. Moreover, each encoding ID includes n elements which also correspond to the first data packet. Secondly, when the coded data packets are acquired, the subsequent successive k−1 first data packets are selected by taking a first data packet as a starting point, and the total amount of the first data packets selected is 1+k−1=k. Thirdly, a specific number (the specific number is related to the encoding IDs and would be described in detail later) of 0 bits are respectively added on data heads or data tails of k first data packets, and a coded data packet is acquired by computing the first data packets after the addition of the 0 bits (namely second data packets). Fourthly, different first data packets are selected respectively; the above steps are repeated; and n coded data packets are acquired respectively. The coded data packets are represented by $P_j$, i=1, 2, . . . , n. Among others, in the above process, the nth first data packet and the $1^{st}$ first data packet are successive. For example, if the n−1 first data packet is selected as the starting point, the subsequent successive k first data packets are n, 1, 2, . . . , k−1. How to acquire the coded data packets and why the coded data packets are mutually independent would be described in detail later.

Step S44: distributing and storing the first data packets and the coded data packets into various storage nodes respectively. In the step, the first data packets and the coded data packets acquired in the above step are stored into various storage nodes after distribution. The process can be as follows: firstly, the n first data packets are respectively stored into the n storage nodes; and secondly, the coded data packet acquired by taking the next first data packet of a first data packet stored into a node is stored into the storage node. The process can also be as follows: the first data packets and the coded data packets are distributed or combined and stored into the storage nodes together. The first data packet and the coded data packet stored into each storage node are mutually independent. Herein, the set of data packets stored into the ith storage node is ($s_i$, $p_i$).

In the step S43 of the embodiment, the process of acquiring the coded data packets further comprises the following steps of:

Step S51: acquiring the encoding IDs. In the step, the encoding ID corresponding to each first data packet is acquired. In the case of n first data packets, n encoding IDs are acquired in the step. Each encoding ID contains n values (or elements) which indicate the number of 0 bits to be added on the data head of each first data packet when the data packet is used for encoding by taking the first data packet corresponding to the encoding ID as the starting point. The process of acquiring the encoding IDs would be described in detail later.

Step S52: adding a specific number of 0 bits on the data head or data tail of each first data packet according to the encoding ID and acquiring k second data packets. In the step, the next first data packet of a first data packet is taken as a starting point, and a corresponding encoding ID is acquired. For example, the next data packet of the ith data packet is the "i+1"th first data packet; the "i+1"th first data packet is taken as the starting point; the "i+1"th encoding ID is selected; 0 bits of which the number is equal to the element value are respectively added on data heads of the subsequent successive k first data packets (namely the "i+1"th first data packet, the "i+2"th first data packet, . . . , the "i+k"th first data packet) of the "i+1"th first data packet according to the corresponding elements of the "i+1"th encoding ID; and meanwhile, $r_{max}-r_i^a$ 0 bits are added on data tails of the data packets, wherein $r_{max}=\max(r_1^a, r_2^a, \ldots, r_n^a)$ is the maximum element value in all the encoding IDs and is solved previously, and the maximum value is k−1 in general; and $r_i^a$ represents the element value of the encoding ID corresponding to the first data packet in the operation. And then a second data packet (for example, corresponding to the "i+1"th first data packet) is acquired; and k second data packets are acquired by repeating the above steps on the subsequent successive first data packets of the starting point.

Step S53: computing the k second data packets and acquiring the coded data packets thereof. In the step, the k second data packets acquired are computed and a coded data packet corresponding to the first data packet taken as the starting point in the above step is acquired, namely $$p_i = \sum_{j=(i+1)\bmod n}^{(k+i)\bmod n} s_j(r_t^j), i = 1, 2, \ldots, n, t \in \{1, 2, \ldots, k\},$$

wherein $p_i$ represents the encoded data packet acquired by taking the next first data packet of the ith first data packet as the starting point; $s_j(r_t^j)$ represents the jth second data packet, and j is a positive integer between (i+1)mod n and (i+k)mod n; and t is between 1 and k along with the successive k data packets, namely t=1 when the successive 1st second data packet is acquired, t=2 when the successive 2nd second data packet is acquired, t=3 when the successive $3^{rd}$ second data packet is acquired, . . . until t=k when the successive kth second data packet is acquired. Among others, in the step, both the computation and addition refer to the XOR (Exclusive OR) operation executed on the data packets mutually.

Step S54: acquiring n coded data packets, in which the steps S52 and S53 are repeated until the n coded data packets are acquired. The set of the n coded data packets constructs a redundancy symbol.

Figure 8:
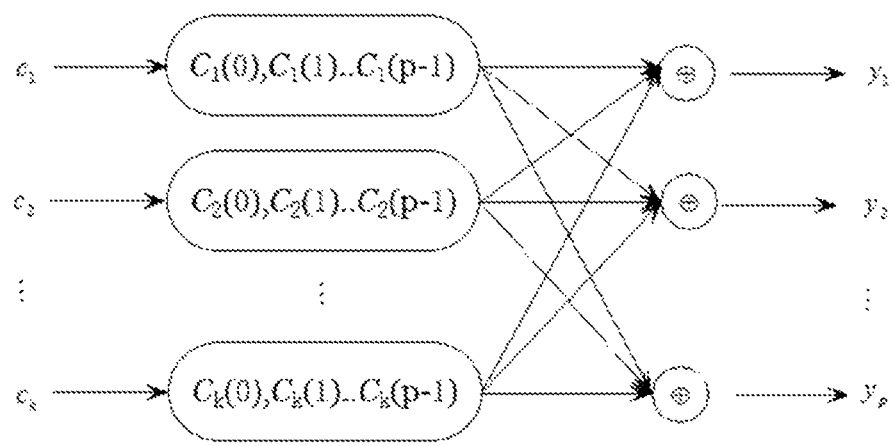
FIG. 8 is a schematic diagram illustrating the process of acquiring the coded data packets in the embodiment.

Moreover, in the embodiment, the process of acquiring the coded data packets is as illustrated in FIG. 8 which illustrates the transformation (conversion) relationship among the first data packets, the second data packets and the coded data packets.

Figure 6:
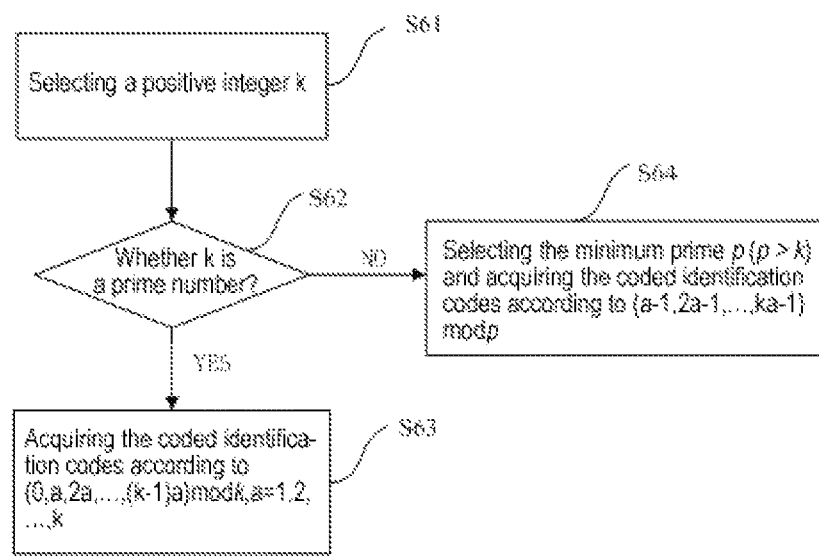
FIG. 6 is a flow chart illustrating the process of acquiring encoding IDs in the embodiment.
Figure 7:
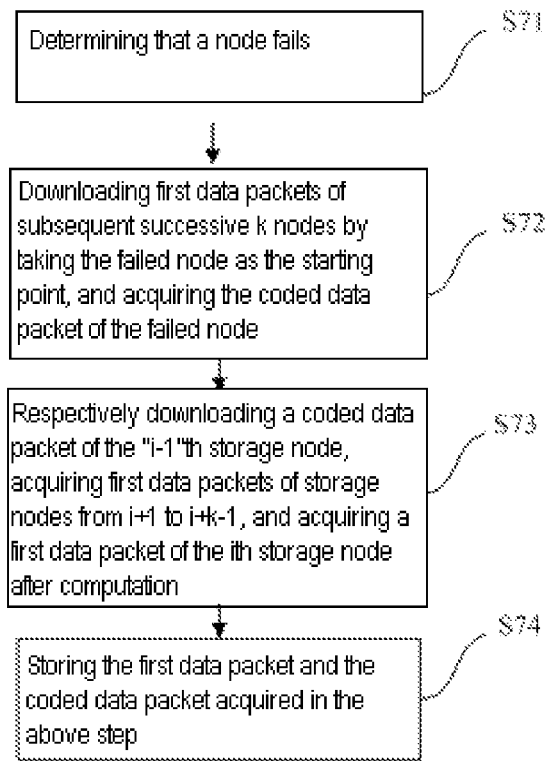
FIG. 7 is a flow chart illustrating the process of repairing the storage nodes in the embodiment.

FIG. 6 illustrates the process of acquiring the encoding IDs in the embodiment. The process comprises the following steps of:

Step S61: determining whether k is a prime number and executing step S62 if so and executing step S63 if not.

Step S62: acquiring k encoding IDs according to ($r_1^a$, $r_2^a$, . . . , $r_k^a$)=(0, a, 2a, . . . , (k−1)a)mod k, a=1, 2, . . . , k; and respectively substituting a=1, 2, . . . , k into an array (0, a, 2a, . . . , (k−1)a), and respectively solving for k mod on acquired elements in the array.

Step S63: selecting the minimum prime p that is more than k and acquiring k encoding IDs according to ($r_1^a$, $r_2^a$, . . . , $r_k^a$)=(a−1, 2a−1, . . . , ka−1)mod p, a=1, 2, . . . , p−1; and respectively substituting a=1, 2, . . . , p−1 into an array (a−1, 2a−1, 2a, . . . , ka−1), and respectively solving for p mod on acquired elements in the array.

In summary, in the embodiment, the traditional MSR codes are all constructed on the basis of the finite field GF(q). In order to reduce the complexity of MSR encoding and computation, the MSR codes based on the finite field GF(2) are used and known as BMSR codes.

In general, data packets which meet the condition that any k data packets among n data packets (including data packets and coded packets) are linearly independent are known as (n, k) independent.

For example, a file $B=\{c_1,c_2\}$ containing two data packets $c_1$ and $c_2$ is acquired. Obviously, there are three linearly independent data packets $\{c_1,c_2,c_1\oplus c_2\}$ by applying XOR coding. However, the requirements of distributed storage systems cannot be met. If a "0" bit is added on the head of the data packet $c_1$ and on the tail of the data packet $c_2$, the changed data packet is represented by $c_i(r_i)$ wherein $r_i$ represents the number of bits added on the head of the data packet $c_i$. As for the three data packets, the changed data packets and the changed coded packets are linearly independent.

In general, k original data packets (with the length of L bits) can be represented by $c_i=b_{i,1} b_{i,2} \ldots b_{i,L}$, $i=1, 2, \ldots, k$. Coded packets $y_a$ are represented by the following formula) $y_a=c_1(r_1)\oplus c_2(r_2)\oplus \ldots \oplus c_k(r_k)$. The number of redundancy bits added on the head of each data packet $c_i$ is $r_{max}=\max\{r_1, r_2, \ldots, r_k\}$. The unique identifier of encoding blocks is represented by $ID_a=(r_1{}^a, r_2{}^a, \ldots, r_k{}^a)$. Obviously, the redundancy bit $r_i$ added on the head of the data packet $c_i$ is equivalent to the formula $c_i(r_i)=2^{r_{max}-r_i}c_i$.

As for any prime number k, the unique identifier of the encoding blocks $y_a$ can be represented by the following formula: $ID=(r_1{}^a, r_2{}^a, \ldots, r_k{}^a)=(0, a, 2a, \ldots, (k-1)a) \bmod k$, $a=1, 2, \ldots, k$. Therefore, n data packets $\{c_1, c_2, \ldots, c_k, y_1, y_2, \ldots, y_{n-k}\}$ acquired by encoding according to the encoding method are linearly independent. For example, when k=5, the coding identifiers are correspondingly $ID_1=(0,1,2,3,4)_1$, $ID_2=(0,2,4,1,3)_2$, $ID_3=(0,3,1,4,2)_3$, $ID_4=(0,4,3,2,1)_4$, $ID_5=(0,0,0,0,0)_5$.

Similarly, as for any other positive integer k that is not a prime number, the minimum prime p can be selected, and p>k. Herein, the coding identifier can be represented by the following formulas:

$$(r_1{}^a,r_2{}^a, \ldots, r_k{}^a)=(a-1,2a-1,\ldots,ka-1)\bmod p, a=1, 2, \ldots, p-1.$$

$$(r_1{}^p,r_2{}^p, \ldots, r_{k-1}{}^p)=(0,0,\ldots,0).$$

For example, when k=4, p=5 is selected, and the coding identifiers are correspondingly $ID_1=(0,1,2,3)_1$, $ID_2=(1,3,0,2)_2$, $ID_3=(2,0,3,1)_3$, $ID_4=(3,2,1,0)_4$, $ID_5=(0,0,0,0)_5$.

In summary, as for any positive integer k, if k is a prime number, (n, k) linearly independent data packets can be constructed by adding (k−1) bit data (k is a prime number) on the head of k original data packets; and if k is not a prime number, (n, k) linearly independent data packets can also be constructed by adding (p−2) bit data (p is a prime number and p>k) on each raw data packet. The construction process of the identifier ID is as follows: a positive integer k is selected and taken as a mod base; and judgment is made whether k is a prime number. If the positive integer k is a prime number, the identifier ID can be represented by the following formula:

$$ID=(r_1{}^a,r_2{}^a, \ldots, r_k{}^a)=(0,a,2a,\ldots,(k-1)a)\bmod k, a=1,2,\ldots,k.$$

If the integer k is not a prime number, the minimum prime p is selected, and p>k. Herein, the identifier ID can be represented by the following formula:

$$(r_1{}^a,r_2{}^a, \ldots, r_k{}^a)=(a-1,2a-1,\ldots,ka-1)\bmod p, a=1, 2, \ldots, p-1.$$

Therefore, the original k data packets can be always constructed into (n, k) linearly independent data packets.

In general, a MSR code with the parameter (n, k, d) contains n nodes which are represented by $\{N_1, N_2, \ldots, N_n\}$. Meanwhile, the BMSR code put forward in the embodiment meets the following two conditions: d=k+1 and B=n.

That is to say, the size of the original file is the same with the number of the storage nodes, and the number of nodes required for repairing a node is d=k+1. Particularly, the construction process of the BMSR code is as follows: dividing raw data B into n data blocks, in which each data block has L bit data which is represented by $S=(s_1, s_2, \ldots, s_n)$; and constructing a redundancy symbol p:

$$P = (p_1, p_2, \ldots, p_n), p_i = \sum_{j=i+1}^{k+i} s_j(r_j^i), i = 1, \ldots, n.$$

Wherein, $r_j^i$ represents the number of "0" bits added on the head of the data packet $S_j$, and then the coded data packet $p_i$ is formed. $r_j^i$ is given in the following formula:

$$(r_j^i,r_{j+1}^i, \ldots, r_{j+k-1}^i)=(r_j^{i+k},r_{j+1}^{i+k}, \ldots, r_{j+k-1}^{i+k})=(a-1,2a-1,\ldots,ka-1)\bmod p$$

Data is stored into each storage node, and the data stored into the storage node $N_i$ (i=1, 2, ..., n) is $(s_i, p_i)$.

In a practical distributed storage system, a node tends to fail and a new node must be introduced into the system to replace the failed node so as to guarantee that the system redundancy may be maintained to be within a certain range. The process is known as "node regeneration". The process of regenerating a failed node in the BMSR code of the embodiment and minimizing the repair bandwidth required comprises the following steps of:

Step S71: determining that a node fails. In the step, the ith storage node is determined to fail, and an encoding ID is acquired. Among others, the serial number of the failed node must be obtained in the step, namely which node fails must be determined Step S72: downloading first data packets of subsequent successive k nodes by taking the failed node as the starting point, and acquiring a coded data packet of the failed node. In the step, as the ith node is the failed node, first data packets of active storage nodes from i+1 to i+k can be downloaded, and the downloaded k storage nodes are successive. The coded data packet of the ith storage node is acquired by executing encoding operation on the downloaded k first data packets. Specifically, the process comprises the following steps of: acquiring k encoding IDs; selecting the maximum encoding ID, namely $r_{max}=(r_1{}^a, r_2{}^a, \ldots, r_n{}^a)$; adding 0 bits with the number of the "i+1"th element value of the encoding ID on the data head of the "i+1"th first data packet, adding $r_{max}-r_i{}^a$ 0 bits on the data tail of the "i+1"th first data packet, and acquiring a second data packet; repeating the above steps on the successive k first data packets beginning from the "i+1"th first data packet, and acquiring k second data packets; and adding the acquired k second data packets (namely executing XOR on the data packets mutually) and acquiring the ith encoded data packet, namely $$p_i = \sum_{j=(i+1)\bmod n}^{(k+i)\bmod n} s_j(r_t^j), i = 1, 2, \ldots, n, t \in \{1, 2, \ldots, k\},$$

in which $p_i$ represents the encoded data packet acquired by taking the next first data packet of the ith first data packet as the starting point; $s_j(r_t^1)$ represents the jth second data packet, and j is a positive integer between (i+1)mod n and (i+k)mod n; t is between 1 and k along with the successive k data packets, namely t=1 when the successive $1^{st}$ second data packet is acquired, t=2 when the successive $2^{nd}$ second data packet is acquired, t=3 when the successive $3^{rd}$ second data packet is acquired, . . . until t=k when the successive kth second data packet is acquired. That is to say, the process is actually the same with that of acquiring the coded data packet of the ith storage node in the case of encoding.

Step S73: respectively downloading a coded data packet of the "i−1"th storage node, acquiring first data packets of storage nodes from i+1 to i+k−1, and acquiring a first data packet of the ith storage node after computation. In the step, the coded data packet of the "i−1"th storage node is downloaded; the first data packets of the storage nodes from i+1 to i+k−1 are acquired (the first data packets have been downloaded in the above steps), in which k−1 storage nodes from which the first data packets are downloaded are successive; and the first data packet of the ith storage node is acquired after executing XOR on the downloaded coded data packet and k−1 original data packets. The computing process comprises the following steps of: downloading the coded data packet of the "i−1"th storage node; acquiring the first data packets of the storage nodes from i+1 to i+k−1, in which the k−1 storage nodes from which the first data packets are downloaded are successive; and acquiring the first data packet of the ith storage node after the addition of 0 bits (namely a second data packet) by executing XOR on the downloaded coded data packet and the k−1 original data packets, namely $$s_i(r_1^{i-1}) = p_{i-1} + \sum_{j=(i+1) \bmod n}^{(i+k-1) \bmod n} s_j(r_t^{i-1}), i = 1, 2, \ldots n, t \in \{2, 3, \ldots, k\},$$

wherein $s_i(i_1^i)$ represents the ith second data packet after the addition of 0 bits; j is a positive integer between (i+1)mod n and (i+k−1)mod n; and t is between 2 and k along with the successive k−1 data packets, namely t=2 when the successive $1^{st}$ second data packet is acquired, t=3 when the successive $2^{nd}$ second data packet is acquired, . . . until t=k when the successive "k−1"th second data packet is acquired. Subsequently, k encoding IDs are acquired; and the first data packet of the ith storage node is acquired by removing the 0 bits added on the data head and the data tail of the previously acquired first data packet after the addition of 0 bits (namely the ith second data packet) according to the encoding IDs.

Step S74: storing the first data packet and the coded data packet acquired in the above step. In the step, the first data packet and the encoded data packet acquired by operation is combined and stored into a new ith storage node.

In the embodiment, the BMSR code can guarantee that the original file can be decoded via the data stored into any k nodes among any n storage nodes, and then the data regeneration may be very easy.

In the embodiment, the construction process of the BMSR code with the parameter (6, 3, 4) is introduced as an example. Supposing the size of the original file is B=n=6, the original file is divided into 6 data symbols, namely $S=(s_1, s_2, \ldots, s_6)$. The data stored into each storage node is $(s_i, p_i)$, wherein $p_i$ is given in the following formula:

$$p_i = \sum_{j=i+1}^{i+3} s_j(r_j^i), i = 1, 2, \ldots, 6$$

$$(r_1^{a+3}, r_2^{a+3}, r_3^{a+3}) = (r_1^a, r_2^a, r_3^a) = (0, a, 2a) \bmod 3, a = 1, 2, 3.$$

Figure 9:
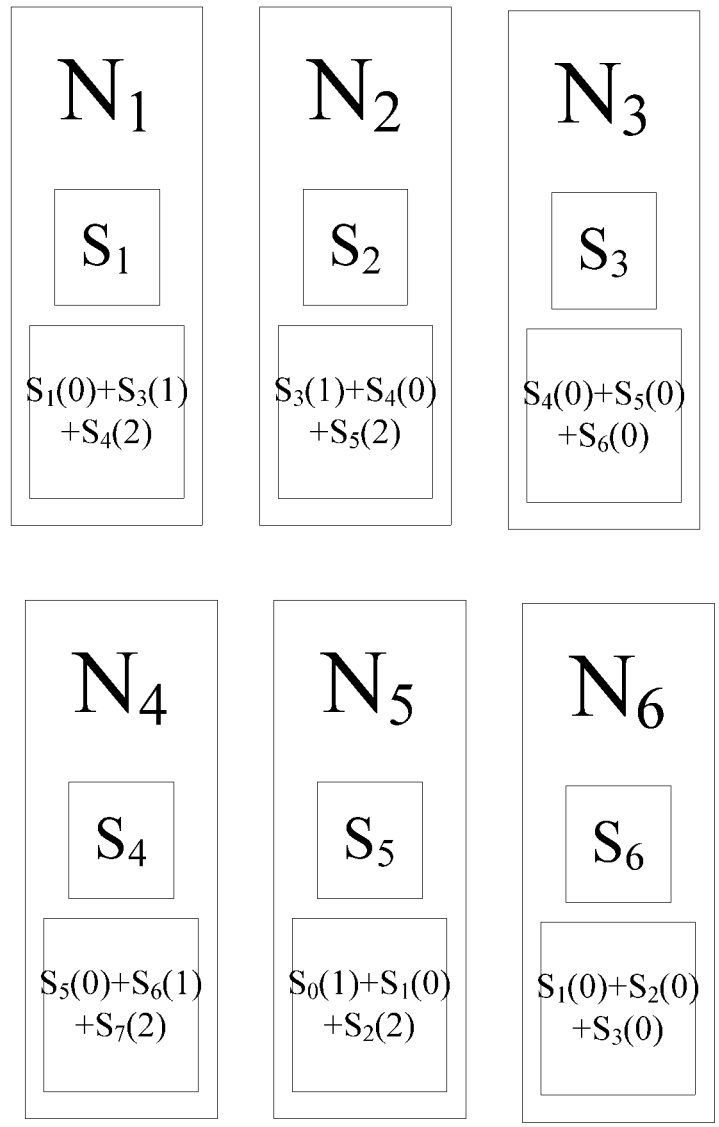
FIG. 9 is a schematic diagram illustrating the process of storing data packets into storage nodes in the embodiment.

In the example, data blocks and redundancy symbols stored into the storage nodes are as illustrated in FIG. 9.

Moreover, the computation complexity of the BMSR code put forward in the embodiment and the traditional RGC and RS code during the encoding, decoding and repairing is mainly analyzed and compared in order to clearly show the advantages of the encoding method in the embodiment. The computation complexity is as follows:

Encoding Computation Complexity

As for the BMSR code, the system has (n−k) check nodes in total; k coded data packets are stored into each check node; and each data packet is acquired by executing XOR on k original data packets. Therefore, the encoding computation complexity is k (n−k) (k−1) XOR.

As for the RGC (based on GF(q)), the system also has (n−k) check nodes in total, and k coded data packets are stored into each check node. The difference is that the coded packets are acquired by executing XOR on k original data packets after corresponding polynomial coefficients are selected in the finite field GF(q). Therefore, the encoding computation complexity of the traditional RGC is k(n−k)(k−1)XOR and $k^2$ (n−k) multiplication in the finite field GF(q).

As for the RS code, the size of the original file is B=k(k+1)/2, and only one data packet is stored into each node. In general, (k+1)/2 times of the data size required by a RS(n, k) code is required to be stored in order to store the file with the size of B. The encoding process of the RS code is similar to that of the RGC. Therefore the computation complexity, of the RS code is k(k+1)(n−k)/2 finite-field multiplication and (k−1)(k+1)(n−k)/2 XOR.

Repair Computation Complexity

During the repair of the BMSR code, if a system node and a check node in the system fail at the same time, the system node can be understood to have higher priority than the check node. That is to say, the system node is repaired at first and then the check node is repaired. At least one check node and at most k check nodes are required for repairing a system node. Therefore, the computation complexity of the repair of one system node is at least (k−1) and at most k(k−1) XOR. Moreover, k system nodes are required for repairing a check node. Therefore, the repair computation complexity of the check node is k(k−1) XOR.

In order to repair a node of the RGC, k assisting nodes converge k data packets into a new node, and the k data packets are regenerated into the previously failed data packet via the computation of the node. Therefore, the computation complexity of the whole repair process is at least $2k^2$ finite-field multiplication and (2k(k−1)) XOR.

As for the RS code, in order to repair a failed node, the data of which the size is the same with that of the original file is required to be downloaded to reconstruct the original file, and the data packet stored into the failed node is regenerated by recoding. The computation complexity of the repair process is ($k^2$ (k+1)/2+k) finite-field multiplication and ($k^2$(k+1)/2+k−1) XOR.

Decoding Computation Complexity

In order to repair the original file, the BMSR code requires the execution of k(k−1)(k+1)/2 XOR. Similarly, the decoding computation complexity of the RGC is $k^3$ finite-field multiplication and $k^3$ XOR, and the decoding computation complexity of the RS code is $k^2$ (k+1)/2 finite-field multiplication and $k^2$ (k+1)/2 XOR.

The computation complexity of the BMSR code, the traditional RGC and the traditional RS code during the encoding, decoding and repairing is as shown in the following table:

| Codes | Encoding Computation | Repairing Computation | Decoding Computation |
|---|---|---|---|
| BMSR | $k(k-1)(n-k) \cdot X$ | $k(k-1) \cdot X$ | $k(k^2-1)/2 \cdot X$ |
| RS | $(k^2-1)(n-k)/2 \cdot X$ $(k^2+k)(n-k)/2 \cdot M$ | $(k^2(k+1)/2+k-1) \cdot X$ $(k^2(k+1)/2+k) \cdot M$ | $k^2(k+1)/2 \cdot X$ $k^2(k+1)/2 \cdot M$ |
| RGC | $k(k-1)(n-k) \cdot X$ $k^2(n-k) \cdot M$ | $2k(k-1) \cdot X$ $2k^2 \cdot M$ | $k^3 \cdot X$ $k^3 \cdot M$ |

Wherein, BMSR, RGC and RS represent the computation complexity of various codes; X represents XOR; and M represents finite-field multiplication.

Compared with the traditional RGC, the major advantage of the BMSR (Binary Minimum-storage Regenerating) code is that the computation complexity during the encoding and decoding is greatly reduced and complex finite-field operation is replaced by simple XOR which is easy to implement. The construction of the traditional RGC is based on the finite field GF(q), and finite-field addition, subtraction and multiplication are designed during the encoding and decoding. Although being mature theoretically, the finite-field operation is relatively complex and consumes a lot of time during the practical application and obviously does not meet the design aim of quickness and reliability of the current distributed storage systems. But the BMSR code is different in that the encoding and decoding operation is only limited to quick XOR, Therefore, the rate of node repair and data block regeneration is greatly improved, and then the BMSR code has high application value and development potential in the practical distributed storage systems.

The BMSR code not only reduces the system computation complexity but also can guarantee that the size of data stored into the nodes is minimum (namely that the original file is simply divided into blocks, without the addition of additional data) and excess bandwidth is not consumed. In today's increasingly valuable storage space and bandwidth resources, the benefits of the BMSR code are obvious. The BMSR code can guarantee that: 1) the missing encoding block can be repaired by directly downloading a plurality of subsets of other encoding fragments; and 2) the missing encoding block can be repaired via a fixed number of encoding fragments, and the fixed number is only related to the number of missing fragments and not related to which fragments are missing. Meanwhile, as for the BMSR code, the data stored into the repaired node is completely equivalent to that of the failed node, which is known as exact repair. Therefore, the system operation complexity (such as metadata update and updated data broadcasting) can be greatly reduced.

The above embodiments only illustrate the implementations of the invention. Although the description is relatively concrete and detailed, it shall not be confirmed to limit the scope of the invention patent. It shall be noted that a plurality of deformations and improvements can also be made by those skilled in the art without departing from the concept of the invention and shall be all within the scope of protection of the invention. Therefore, the scope of protection of the invention patent shall be determined by the claims.

What is claimed is:

1. A method for encoding (Minimum Storage Regenerating (MSR) codes in a distributed data storage system, comprising the steps of:
   A) dividing raw data into n mutually independent first data packets, each of equal length, in which the first data packets are represented by $S_i$, i=1, 2, . . . , n, and n being an even integer;
   B) forming n storage nodes and a positive integer k+1 repair nodes, in which n=2k and k is a positive integer, in a distributed data storage system;
   C) constructing n encoding IDs, each corresponding to a respective first data packet, taking a first data packet as a starting point and selecting k total first data packets, respectively adding a specified number of 0 bits on data heads or data tails of the k first data packets to create k second data packets and selecting an unselected first data packet as starting point and repeating the above steps to create n encoded data packets represented by $P_i$, i=1, 2, . . . , n;
   D) storing each first data packet and encoded data packet into respective storage nodes;
   I) determining that an ith storage node fails and retrieving a corresponding encoding ID;
   J) downloading first data packets in active storage nodes from i+1 to i+k in turn, in which the downloaded k storage nodes being successive; and acquiring an encoded data packet of the ith storage node by executing XOR calculation on the downloaded k first data packets;
   K) repairing the storage nodes by downloading an encoded data packet of the "i−1"th storage node and retrieving first data packets of storage nodes from i+1 to i+k−1, in which k−1 storage nodes from which the first data packets are downloaded are successive and retrieving a first data packet of the ith storage node by executing XOR coding on the downloaded encoded data packet and k−1 first data packets; and
   L) combining the first data packet and the encoded data packet retrieved by operation and storing the first data packet and the encoded data packet into a new ith storage node.

2. The method for encoding the MSR codes according to claim 1, wherein the step C) further comprises:
   wherein each encoding ID contains n values and indicates the specified number of 0 bits, taking a next first data packet of an ith first data packet as the starting point, respectively adding the specified number of 0 bits on the data heads or data tails of the starting point and the subsequent successive k−1 first data packets according to corresponding encoding IDs, and creating the k second data packets; and
   respectively taking the subsequent first data packet of the first data packet taken as the starting point as a starting point, and repeating until the n encoded data packets are created.

3. The method for encoding the MSR codes according to claim 2, wherein the step C1) further comprises the following steps of:
   C11) determining whether k is a prime number, and executing step C12) if so and executing step C13) if not;
   C12) respectively substituting a =1, 2, . . . , k into an array (0, a, 2a, . . . , (k−1)a) according to $(r_1^a, r_2^a, \ldots, r_k^a)$=(0, a, 2a, . . . , (k−1)a) mod k, a=1, 2, . . . , k, respectively solving for k mod on acquired elements in the array, and acquiring the k encoding IDs; and
   C13) selecting the minimum prime p that is more than k, respectively substituting a=1, 2, . . . , p−1 into an array (a−1, 2a−1, 2a, . . . , ka−1) according to $(r_1^a, r_2^a, \ldots, r_k^a)$=(a−1, 2a−1, . . . , ka−1) mod p, a=1, 2, . . . , p−1, respectively solving for p mod on acquired elements in the array, and acquiring the k encoding IDs.

4. The method for encoding the MSR codes according to claim 3, wherein the step C2) further comprises the following steps of:
- C21) selecting the maximum encoding ID, namely $r_{max} = \max(r_1^a, r_2^a, \ldots, r_n^a)$;
- C22) adding 0 bits with the number of the "i+1"th element value of the encoding ID on a data head of the "i+1"th first data packet, adding $r_{max} - r_i^a$ 0 bits on a data tail of the "i+1"th first data packet, and acquiring a second data packet; and repeating the above steps on the successive k first data packets beginning from the "i+1"th first data packet, and acquiring the k second data packets; and
- C23) adding the acquired k second data packets and acquiring the ith encoded data packet, namely $$p_i = \sum_{j=(i+1) \bmod n}^{(k+i) \bmod n} s_j(r_t^j), i = 1, 2, \ldots, n, t \in \{1, 2, \ldots, k\},$$

in which $p_i$ represents the encoded data packet acquired by taking the next first data packet of the ith first data packet as the starting point; $s_j(r^t)$ represents the jth second data packet, and j is a positive integer between $(i+1) \bmod n$ and $(i+k) \bmod n$; and t is between 1 and k along with the successive k data packets, namely t=1 when the successive $1^{st}$ second data packet is acquired, t=2 when the successive $2^{nd}$ second data packet is acquired, . . . until t=k when the successive kth second data packet is acquired.

5. The method for encoding the MSR codes according to claim 4, wherein the first data packets and the encoded data packets in the storage nodes are respectively stored, and the set of data packets stored into the ith storage node is represented by $(s_i, p_i)$.

6. The method for encoding the MSR codes according to claim 5, wherein the data size of an original file is n.

7. The method of claim 1, wherein the step J) further comprises the following steps of:
- J1) acquiring k encoding IDs;
- J2) selecting the maximum encoding ID, namely $r_{max} = \max(r_1^a, r_2^a, \ldots, r_n^a)$;
- J3) adding 0 bits with the number of the "i+1"th element value of the encoding ID on a data head of the "i+1"th first data packet, adding $r_{max} - r_i^a$ 0 bits on a data tail of the "i+1"th first data packet, and acquiring a second data packet; and repeating the above steps on successive k first data packets beginning from the "i+1"th first data packet, and acquiring k second data packets; and
- J4) adding the acquired k second data packets and acquiring the ith encoded data packet, namely $$p_i = \sum_{j=(i+1) \bmod n}^{(k+i) \bmod n} s_j(r_t^j), i = 1, 2, \ldots, n, t \in \{1, 2, \ldots, k\},$$

in which $p_i$ represents the encoded data packet acquired by taking the next first data packet of the ith first data packet as a starting point; $s_j(r_t^i)$ represents the jth second data packet, and j is a positive integer between $(i+1) \bmod n$ and $(i+k) \bmod n$; and t is between 1 and k along with the successive k data packets, namely t=1 when the successive $1^{st}$ second data packet is acquired, t=2 when the successive $2^{nd}$ second data packet is acquired, . . . until t=k when the successive kth second data packet is acquired.

8. The method of claim 1, wherein the step K) further comprises the following steps of:
- K1) downloading the encoded data packet of the "i−1"th storage node and acquiring the first data packets of the storage nodes from i+1 to i+k−1, in which the k−1 storage nodes from which the first data packets are downloaded are successive;
- K2) acquiring a corresponding second data packet of the ith storage node by executing XOR coding on the encoded data packet of the "i−1"th storage node and k−1 first data packets, namely $$s_i(r_1^{j-1}) = p_{i-1} + \sum_{j=(i+1) \bmod n}^{(i+k-1) \bmod n} s_j(r_t^{j-1}), i = 1, 2, \ldots n, t \in \{2, 3, \ldots, k\},$$

in which $s_i(r_1^t)$ represents the ith second data packet; j is a positive integer between $(i+1) \bmod n$ and $(i+k-1) \bmod n$; and t is between 2 and k along with the successive k−1 data packets, namely t=2 when the successive $1^{st}$ second data packet is acquired, t=3 when the successive $2^{nd}$ second data packet is acquired, . . . until t=k when the successive "k−1"th second data packet is acquired;
- K3) acquiring the k encoding IDs; and
- K4) removing the 0 bits added on the data head and the data tail of the acquired ith second data packet according to the encoding ID, and acquiring the ith first data packet of the ith storage node.

\* \* \* \* \*